US010649255B2

(12) United States Patent
Kim et al.

(10) Patent No.: US 10,649,255 B2
(45) Date of Patent: May 12, 2020

(54) DISPLAY APPARATUS

(71) Applicant: SAMSUNG ELECTRONICS CO., LTD., Suwon-si (KR)

(72) Inventors: Boum-Sik Kim, Hwaseong-si (KR); Sang Kyeong Ha, Suwon-si (KR); Eun Bi Kang, Daejeon (KR); Myeong Gil Kim, Suwon-si (KR); Jin Young Shin, Seoul (KR); Hyun Jun Jung, Yongin-si (KR); Ho Suk Chae, Seoul (KR); Jong Hee Han, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/852,162

(22) Filed: Dec. 22, 2017

(65) Prior Publication Data
US 2018/0180929 A1 Jun. 28, 2018

(30) Foreign Application Priority Data

Dec. 23, 2016 (KR) .......................... 10-2016-0178593

(51) Int. Cl.
*G02F 1/13* (2006.01)
*H01F 7/02* (2006.01)
(Continued)

(52) U.S. Cl.
CPC ...... *G02F 1/133308* (2013.01); *G06F 1/1601* (2013.01); *H01F 7/02* (2013.01);
(Continued)

(58) Field of Classification Search
CPC ...... H05K 5/03; H05K 5/0017; H05K 5/0234; H05K 5/02; H05K 5/0217; H05K 5/0204;
(Continued)

(56) References Cited

U.S. PATENT DOCUMENTS

2006/0070280 A1* 4/2006 Yamamura ............ G06F 1/1601
40/564
2006/0104023 A1* 5/2006 Lee .......................... G06F 1/20
361/679.48
(Continued)

FOREIGN PATENT DOCUMENTS

EP 2757408 A1 7/2014
KR 1020070057332 A 6/2007
(Continued)

OTHER PUBLICATIONS

International Search Report (PCT/ISA/210), issued by International Searching Authority in corresponding International Application No. PCT/KR2017/015079, dated Apr. 10, 2018.
(Continued)

*Primary Examiner* — Adam B Dravininkas
(74) *Attorney, Agent, or Firm* — Sughrue Mion, PLLC

(57) ABSTRACT

Disclosed herein is a display apparatus. The display apparatus includes a display panel, a display chassis configured to support the display panel, and a cover provided on a rear side of the display chassis. The cover includes a cover body configured to cover a rear surface of the display chassis, and a plurality of magnets disposed on the cover body and configured to generate an attractive force such that the cover body is attached to the rear surface of the display chassis. The cover is configured to be coupled and fixed to at least a part of peripheries of the display chassis and the cover body. With this configuration, assembly efficiency of the display apparatus may be improved.

14 Claims, 16 Drawing Sheets

(51) Int. Cl.
    *G06F 1/16* (2006.01)
    *G02F 1/1333* (2006.01)
    *H05K 7/20* (2006.01)
    *F21V 8/00* (2006.01)

(52) U.S. Cl.
    CPC ....... *H01F 7/0252* (2013.01); *H05K 7/20954* (2013.01); *G02B 6/0086* (2013.01); *G02F 2001/13332* (2013.01); *G02F 2001/133314* (2013.01); *G02F 2001/133317* (2013.01); *G02F 2001/133322* (2013.01); *G02F 2001/133325* (2013.01); *G02F 2001/133328* (2013.01); *G02F 2201/36* (2013.01); *G02F 2201/46* (2013.01)

(58) Field of Classification Search
    CPC ........ H05K 2201/10128; H01F 7/0252; H01F 7/04; H01F 7/02; H01F 7/0205; H01F 41/00; G02F 1/133308; G02F 2001/133314; G02F 2201/46; G02F 2001/133322; G02B 6/0068; G02B 6/0018
    See application file for complete search history.

(56) References Cited

U.S. PATENT DOCUMENTS

2011/0025928 A1* 2/2011 Yokota ............. G02F 1/133604
                                                                    348/739
    2011/0141671 A1* 6/2011 Ishizu .................... F16M 11/10
                                                                    361/679.01
    2012/0257397 A1* 10/2012 Lee .......................... F21V 15/01
                                                                    362/374
    2016/0291388 A1* 10/2016 An .................... G02F 1/133308
    2017/0139258 A1* 5/2017 Jiang ................ G02F 1/133308

FOREIGN PATENT DOCUMENTS

KR      1020100044074 A      4/2010
    KR      10-1275492 B1         6/2013
    KR      1020140056059 A      5/2014
    KR      1020140093140 A      7/2014
    KR      1020140093141 A      7/2014
    WO      2015040741 A1         3/2015

OTHER PUBLICATIONS

Communication dated Jul. 26, 2019, from the European Patent Office in counterpart European Application No. 17882709.3.

Communication dated Nov. 6, 2019, from the European Patent Office in counterpart European Application No. 17882709.3.

Machine translation of WO 2015040741 A1, published Mar. 26, 2015 (of record).

* cited by examiner

DISPLAY APPARATUS

CROSS-REFERENCE TO RELATED APPLICATION

This application claims priority from Korean Patent Application No. 10-2016-0178593, filed on Dec. 23, 2016 in the Korean Intellectual Property Office, the disclosure of which is incorporated herein by reference.

BACKGROUND

1. Field

Example embodiments of the present disclosure relate to a display apparatus, and more particularly, to a display apparatus with an improved assembly structure.

2. Description of the Related Art

Generally, a display apparatus is an apparatus for displaying a screen and includes a monitor or a television. Display apparatuses include emissive display panels such as organic light-emitting diode (OLED) panels and non-emissive display panels such as liquid-crystal display (LCD) panels.

The present disclosure relates to a display module and a display apparatus to which a non-emissive display panel is applied. A display apparatus to which a non-emissive display panel is applied includes a display panel, which is formed as a liquid crystal panel and displays a screen, and a backlight unit which supplies light to the display panel. The backlight unit includes a light source module having a light source, a light guide plate which receives light from the light source and emits the light to the display panel, and a plurality of optical sheets through which light passed through the light guide plate passes. In this case, the optical sheet may be made with a reflective sheet, a light guide plate or a diffusion sheet, a prism sheet, a diffusion sheet, a polarizing sheet, or the like.

The display panel and the backlight unit may be enclosed inside a display chassis and supported by the display chassis. The display apparatus may include a cover which covers a rear surface of the display chassis to protect the rear surface of the display chassis or prevent the rear surface of the display chassis from being exposed to the outside.

As a larger display panel with higher image quality than a conventional display panel is used in the display apparatus, sizes of the display chassis and the cover also increase. When assembling the cover to the display chassis, a complex series of steps is required for the coupling process with respect to a large area, which may decrease production efficiency.

SUMMARY

An aspect of the present disclosure provides a display apparatus with an improved assembly structure.

Another aspect of the present disclosure provides a display apparatus with a simplified assembly process.

Still another aspect of the present disclosure provides a display apparatus with improved durability.

Additional aspects of the disclosure will be set forth in part in the description which follows and, in part, will be obvious from the description, or may be learned by practice of the disclosure.

According to an aspect of an example embodiment, a display apparatus may include a display panel, a display chassis configured to support the display panel, and a cover provided on a rear side of the display chassis. The cover may include a cover body configured to cover a rear surface of the display chassis, and a plurality of magnets disposed on the cover body and configured to generate an attractive force such that the cover body is attached to the rear surface of the display chassis. The cover may be configured to be coupled and fixed to at least a part of peripheries of the display chassis and the cover body.

The plurality of magnets may be disposed inside the cover body.

The cover may further include a cover coupler provided on a side surface of the cover body and configured to be coupled to a side surface of the display chassis.

The display chassis may include a rear chassis configured to support a rear side of the display panel and a front chassis having an edge disposed along a periphery of the display panel. The cover coupler may be configured to be bent from the cover body and face the edge of the front chassis.

The cover may be coupled to a rear surface of the rear chassis due to the attractive force of the plurality of magnets. The cover may be fixed to the display chassis by coupling the cover coupler and the edge.

The display chassis may further include a sliding holder provided on the rear surface of the display chassis. The cover may further include a sliding coupler provided inside the cover body and fitted and coupled to the sliding holder in a first direction when being coupled with the sliding holder.

The plurality of magnets may be arranged in the first direction.

The display apparatus may further include a printed circuit board (PCB) provided on the rear surface of the display chassis, a first vent hole formed in one of the cover and the display chassis and formed below the PCB, and a second vent hole formed in one of the cover and the display chassis and formed above the PCB.

The cover body may include an outer cover and an inner cover disposed to be covered by the outer cover and having a magnet holder for mounting at least one of the plurality of magnets.

The magnet holder may be formed to protrude from the inner cover toward the rear surface of the display chassis.

The magnet holder may form a mounting space configured to be covered by the outer cover. The at least one of the plurality of magnets may be mounted in the mounting space.

The magnet holder may include an elastic locking member configured to prevent the at least one of the plurality of magnets from being separated from the magnet holder when the at least one of the plurality of magnets is mounted in a mounting space in the magnet holder.

The outer cover may include a metal and the inner cover may include plastic.

The cover body may include a first cover configured to cover at least a first part of the rear surface of the display chassis and formed of a metal, and a second cover configured to cover a second part of the rear chassis and formed of plastic. The plurality of magnets may be provided in an inner surface of at least one of the first and second covers.

The cover body may include a magnet holder on which at least one of the plurality of magnets is mounted. The cover body may be integrally formed with the magnet holder.

The cover may be fitted and coupled to the display chassis in the first direction. The plurality of magnets may be arranged in the first direction. An intensity of a magnetic force of each of the plurality of magnets may vary in the first direction.

According to an aspect of an example embodiment, a display apparatus may include a display panel, a display chassis having a front chassis provided along a periphery of the display panel and a rear chassis disposed on a rear side of the display panel to support, together with the front chassis, the display panel, and a cover provided on a rear surface of the display chassis. The cover may include a cover body configured to cover the rear surface of the display chassis, a plurality of magnets provided inside the cover body and configured such that the cover is attached to the rear chassis and is coupled to the display chassis, and a cover coupler configured to be bent from a periphery of the cover body to face a side surface of the display chassis and coupled to the front chassis.

The cover body may form a space with the display chassis on a rear side of the display chassis. The cover may further include a vent hole formed in the cover body and configured to allow outside air to flow into and out of the space.

The display apparatus may further include a PCB provided on the rear surface of the display chassis. The vent hole may include a first vent hole formed below the PCB and a second vent hole formed above the PCB.

According to an aspect of an example embodiment, a display apparatus may include a display panel, a display chassis having a front chassis provided along a periphery of the display panel and a rear chassis disposed on a rear side of the display panel to support, together with the front chassis, the display panel, and a cover configured to cover a rear surface of the rear chassis and form a space with the rear chassis. The cover may include a vent hole provided to allow outside air to circulate through the space, a cover body configured to cover the rear surface of the rear chassis, a plurality of magnets configured to generate an attractive force on an inner surface of the cover body such that the cover body is attached to the rear chassis, and a cover coupler configured to extend from a periphery of the cover body and attach to the front chassis.

BRIEF DESCRIPTION OF THE DRAWINGS

These and/or other aspects of the disclosure will become apparent and more readily appreciated from the following description of the example embodiments, taken in conjunction with the accompanying drawings of which.

DETAILED DESCRIPTION

Figure 1:
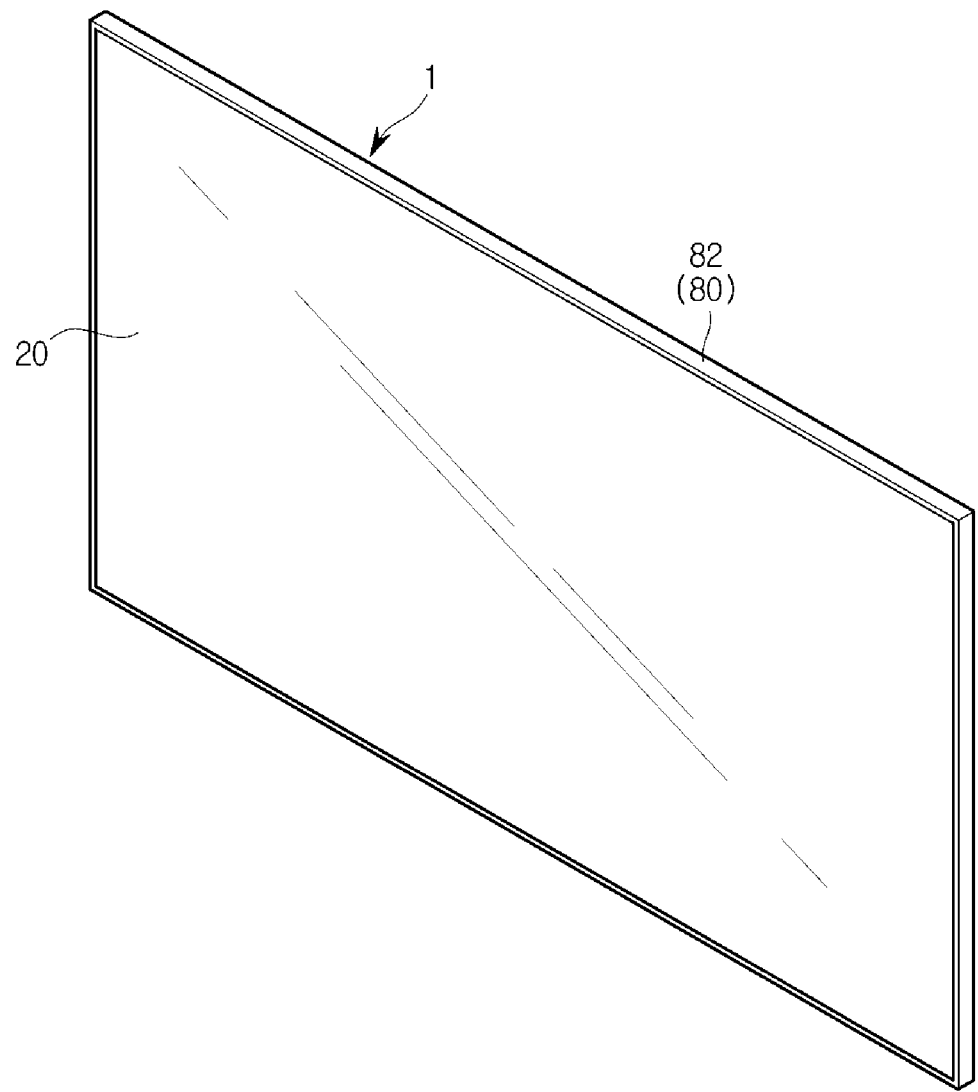
FIG. 1 is a perspective view of a display apparatus according to an example embodiment.

Embodiments described in this specification and configurations illustrated in drawings are only examples of the disclosed disclosure. It should be understood that the disclosure covers various modifications that can substitute for the embodiments herein and drawings at a time of filing of this application.

In addition, the same reference numerals or symbols given in the drawings of the present disclosure indicate parts or components that perform substantially the same function.

It should be understood that the terminology used herein is for the purpose of describing particular example embodiments only and is not intended to limit the disclosure. As used herein, the singular forms "a," "an," and "the" are intended to include the plural forms as well, unless the context clearly indicates otherwise. It should be further understood that the terms "comprise," "comprising," "include," and/or "including," when used herein, specify the presence of stated features, integers, steps, operations, elements, parts, and/or combinations thereof, but do not preclude the presence or addition of one or more other features, integers, steps, operations, elements, parts, and/or combinations thereof.

It should be understood that, although the terms "first," "second," etc. may be used herein to describe various elements, these elements are not to be limited by these terms. These terms are only used to distinguish one element from another. For example, a first element could be termed a second element, and, similarly, a second element could be termed a first element without departing from the scope of the present disclosure. As used herein, the term "and/or" includes any and all combinations of one or more of the associated listed items.

Hereinafter, example embodiments of the present disclosure will be described in detail with reference to the accompanying drawings.

Figure 2:
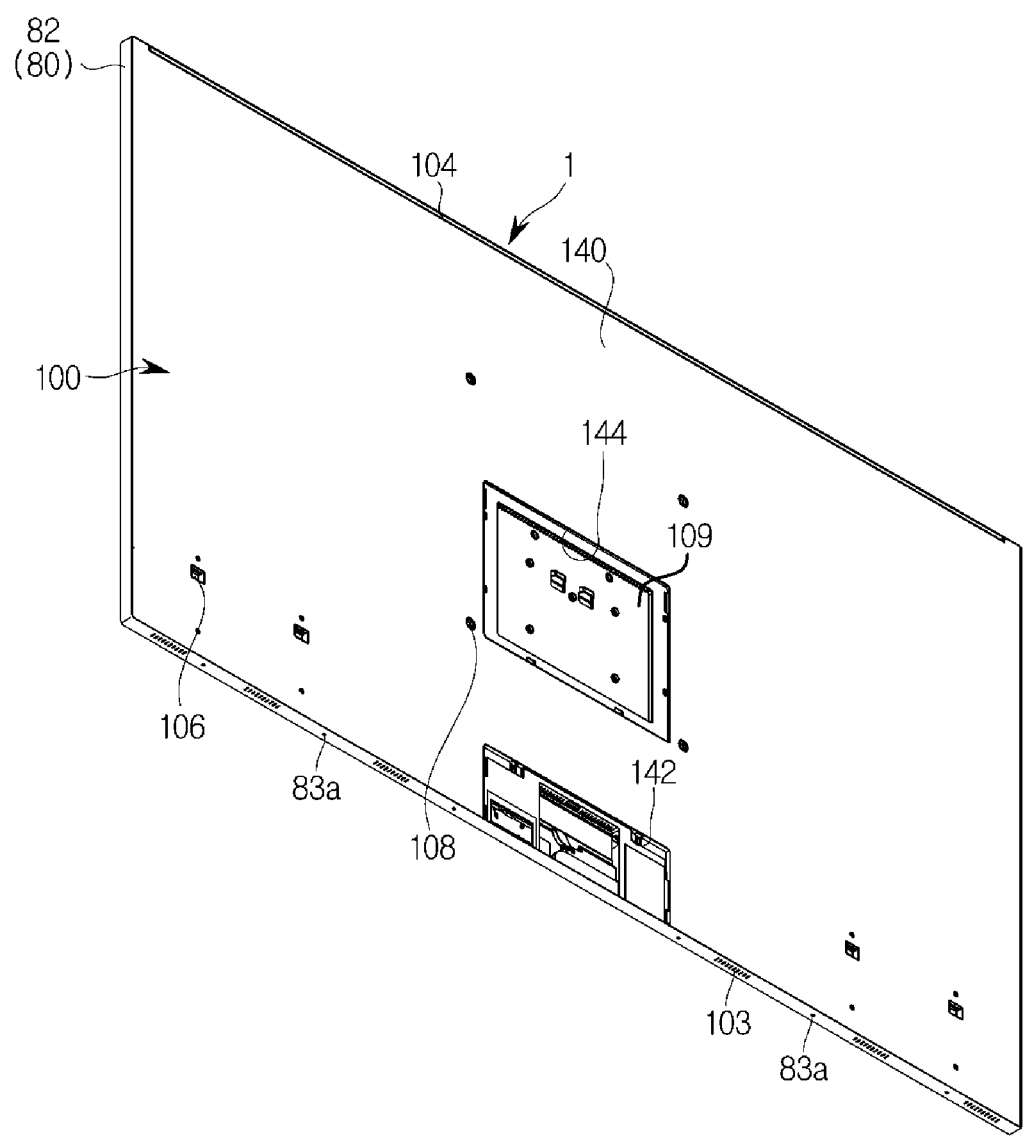
FIG. 2 is a rear perspective view of the display apparatus according to an example embodiment.
Figure 3:
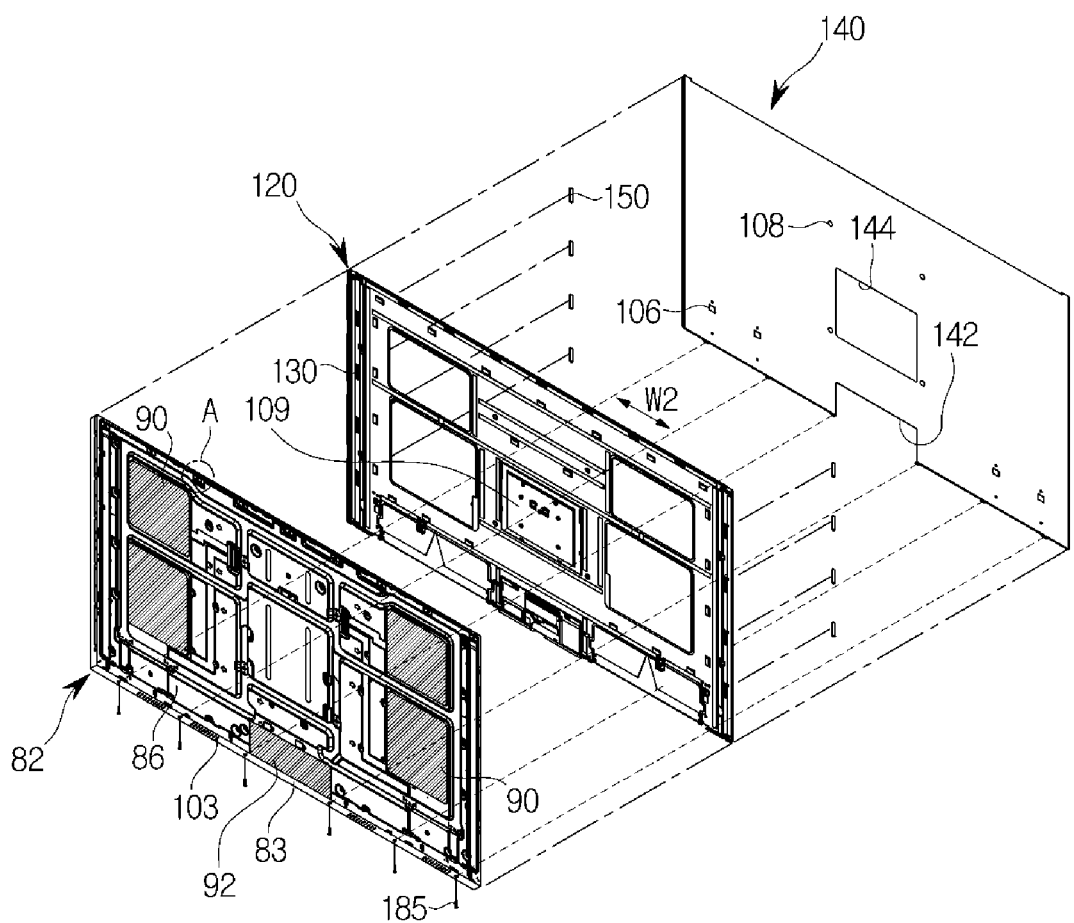
FIG. 3 is an exploded perspective view illustrating some configurations of the display apparatus according to an example embodiment.
Figure 4:
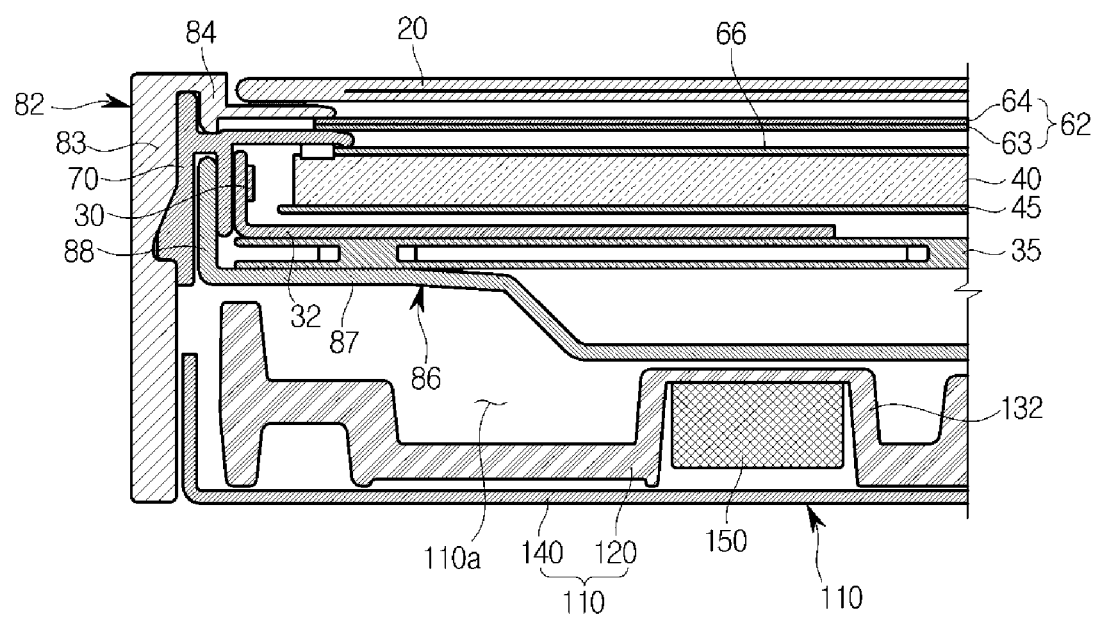
FIG. 4 is a cross-sectional view of the display apparatus according to an example embodiment of the present disclosure.

FIG. 1 is a perspective view of a display apparatus according to an example embodiment, FIG. 2 is a rear perspective view of the display apparatus according to an example embodiment, FIG. 3 is an exploded perspective view illustrating some configurations of the display apparatus according to an example embodiment, and FIG. 4 is a cross-sectional view of the display apparatus according to an example embodiment.

Although a flat display apparatus 1 is described as an example in the present disclosure, the present disclosure may be applied to a curved display apparatus or a bendable/flexible display apparatus.

Such a display apparatus 1 includes a display module which displays an image therein.

The display module includes a display panel 20 on which an image is displayed, and a backlight unit which supplies light to the display panel 20. The backlight unit may include a light source 30 and a sheet member. Specifically, the backlight unit may include a pair of light sources 30 disposed on both sides (e.g., left and right) of a rear side of the display panel 20, a light guide plate 40 which is disposed in a space between the display panel 20 and the light sources 30 to diffuse and transmit light transmitted from a rear side of the display apparatus to the display panel 20 located at a front side of the display apparatus, the sheet member which changes optical properties of the light, a middle mold 70 which supports the display panel 20 and the light guide plate 40, and a display chassis 80 which forms an exterior of the display apparatus. The display chassis 80 includes a front chassis 82 disposed along a periphery of the display panel 20 and a rear chassis 86 coupled to a rear side of the middle mold 70 and having the pair of above-described light sources 30 disposed on both sides (e.g., left and right) therein.

The pair of light sources 30 may be disposed at both of the sides of an inside of the rear chassis 86 to apply light toward a center of the interior space of the rear chassis 86. According to an aspect of an example embodiment, the pair of light sources 30 are disposed at both sides (e.g., left and right) of a display module, but the present disclosure is not limited thereto. The light source 30 may be applied to only one side of the display module or may be applied along a periphery (e.g., left, right, top, bottom, etc.) of the display module. Such an edge display type light source may be applied to the display module, or a direct display type light source may be applied thereto. The light source 30 may be mounted on a printed circuit board (PCB) 32, and a heat sink 35 for dissipating heat generated in the light source 30, the PCB 32, and the display module may be provided below the PCB 32.

The light guide plate 40, the display panel 20, and the front chassis 82 are sequentially installed on a front side of the middle mold 70, and the rear chassis 86 is installed on a rear side of the middle mold 70. The middle mold 70 supports the configurations and keeps the display panel 20 and the rear chassis 86 separated from each other.

The front chassis 82 may include an edge 83, which forms a side surface of the display apparatus, and a panel support 84, which extends from the edge 83 and supports the display panel 20. The edge 83 may be formed along the periphery of the display panel 20 or the rear chassis 86 and may be configured to extend rearward past the rear chassis 86.

The rear chassis 86 includes a rear surface 87, which forms a rear surface of the display module, and a side surface 88, which extends in a frontward direction from a periphery of the rear surface 87 and is coupled to the middle mold 70.

The sheet member may include an optical sheet 62, which is disposed between the light guide plate 40 and the display panel 20 and changes optical properties of light, and a quantum dot (QD) sheet 66 disposed on a front surface of the light guide plate 40.

The optical sheet 62 may include a diffuser sheet 63 which diffuses incident light, and a dual brightness enhancement film (DBEF) sheet 64 which is a high-luminance prism sheet. The optical sheet 62 is disposed between the light guide plate 40 and the display panel 20 and changes optical properties of light emitted from the light guide plate 40.

The QD sheet 66 is provided for color reproducibility. Color reproducibility refers to a measure of how close to natural color a reproduced color is, and how large of an area (i.e., color gamut) can be expressed in color space. Since color purity of white light is higher than that in a conventional technology of converting light of a white light-emitting diode (LED) into a specific color using a color filter, efficiency of light passing through the color filter is increased, and thus overall power efficiency of a display may be increased.

QDs will be described. Generally, when electrons receive energy, the electrons in a valence band are excited to a conduction band. After that, the electrons lose energy and fall to the valence band. At this time, the electrons emit energy as light. QDs generate strong fluorescent light in a narrow wavelength band. It is possible to generate all colors of visible light according to sizes of the QDs. In addition, since the QDs generate natural color in themselves, there is no color loss, and the QDs are materials having high color reproducibility. The QDs generate light of a short wavelength as sizes of particles of the QDs are reduced, and generate light of a long wavelength as the sizes of the particles are increased. The QDs may be compounds such as cadmium selenide (CdSe), cadmium sulfide (CdS), cadmium telluride (CdTe), zinc selenide (ZnSe), zinc telluride (ZnTe), zinc sulfide (ZnS), and the like.

The QD sheet 66 may be provided such that light passing through the light guide plate 40 is emitted via the QD sheet 66. The QD sheet 66 may be provided to be in close contact with the light guide plate 40 on the front surface of the light guide plate 40. The QD sheet 66 is in close contact with the light guide plate 40 so that the light emitted from the light guide plate 40 passes therethrough.

Since light from the light source 30 reaches the QD sheet 66 via the light guide plate 40, the QD sheet 66 is less affected by heat from an LED and reliability thereof may be improved.

The QD sheet 66 may include a yellow QD sheet corresponding to a blue light-emitting element. Blue light emitted from the blue light-emitting element is converted into white light while passing through the yellow QD sheet 66.

The light guide plate 40 may include a reflective member 45 on a back surface thereof. The reflective member 45 may be provided on the back surface of the light guide plate 40 such that all light generated by the light source 30 can be directed to a front side thereof. The reflective member 45 may be disposed on the back surface of the light guide plate 40 separately from the light guide plate 40 as a reflector, or may be integrally formed with the light guide plate 40. The same effect as the above effect may be obtained by applying a reflective coating to the back surface of the light guide plate 40.

The light guide plate 40 is provided to transmit the light generated by the light source 30. To this end, the light guide plate 40 may be formed of a transparent resin material. The light guide plate 40 may be disposed to be spaced a predetermined distance from the light source 30 to minimize deformation thereof caused by heat generated in the light source 30.

The display apparatus 1 may include a cover 100.

The cover 100 may be configured to cover a rear side of the display chassis 80. A PCB and electrical components 90, such as a control board and the like of a display apparatus, may be disposed on the rear surface of the display chassis 80. The cover 100 may protect the electrical components 90 from being exposed to the outside. At least a part of the cover 100 is formed to be a smooth surface, and the cover 100 may be configured such that a rear surface of the display apparatus 1 has a clean appearance.

The cover 100 includes fastening parts 106 and 108 for placement of the display apparatus 1 on an outer surface thereof. Specifically, the cover 100 may include first and second wall-mounted fastening parts 108 and 109 and a stand-type fastening part 106. A user may determine whether a wall-mounted type display apparatus or a stand-type display apparatus is used as the display apparatus 1, and accordingly, a wall-mounted type part or a stand-type part may be used by being coupled to a corresponding fastening part. The second wall-mounted fastening part 109 may be configured to be fixed to a wall through a separate fastening part. To this end, the cover 100 may include a fastening part hole 144 which is open at a location corresponding to the second wall-mounted fastening part 109.

The display apparatus 1 may include vent holes 103 and 104. The vent holes 103 and 104 are configured to allow outside air to flow into and out of the display apparatus 1 so that heat generated in the display apparatus 1 may be discharged. As described above, the PCB or the electrical components 90, such as a control board and the like, may be disposed on the rear side of the display chassis 80. The vent holes 103 and 104 are configured to allow air to circulate to discharge heat generated in the electrical components 90 or heat from the light source 30 to the outside of the display apparatus.

The cover 100 may form a predetermined space 110a (see FIG. 4) with the display chassis 80, and may be configured to cover the rear surface of the display chassis 80. The vent holes 103 and 104 are configured to allow outside air to flow into and out of the predetermined space 110a.

The vent holes 103 and 104 may include a first vent hole 103 and a second vent hole 104. The first vent hole 103 may be disposed below the electrical components 90, and the second vent hole 104 may be disposed above the electrical components 90. The first vent hole 103 may be formed in the edge 83 of the display chassis 80, and the second vent hole 104 may be disposed in the cover 100. However, the present disclosure is not limited thereto, and all of the first and second vent holes 103 and 104 may be formed in the cover 100 or may be formed in the display chassis 80. The first and second vent holes 103 and 104 may be disposed on upper and lower portions of the display chassis 80 with the electrical components 90 interposed therebetween so that air introduced from the first vent hole 103 is heated and discharged through the second vent hole 104.

The display apparatus 1 may include a wireless communicator 92. The wireless communicator 92 may be provided to allow the display apparatus 1 to communicate with the outside (e.g., an external device). In the present embodiment, the wireless communicator 92 is illustrated as being located on the rear surface of the front chassis 82, but the present disclosure is not limited thereto, and the wireless communicator 92 may be located at an inner cover 120. An outer cover 140 may include a cover opening 142 which is formed to open at a location corresponding to the wireless communicator 92 such that the wireless communicator 92 may effectively perform communication. The cover opening 142 may be provided in the outer cover 140 formed of a metal so that the wireless communicator 92 may effectively communicate with the outside.

Figure 5:
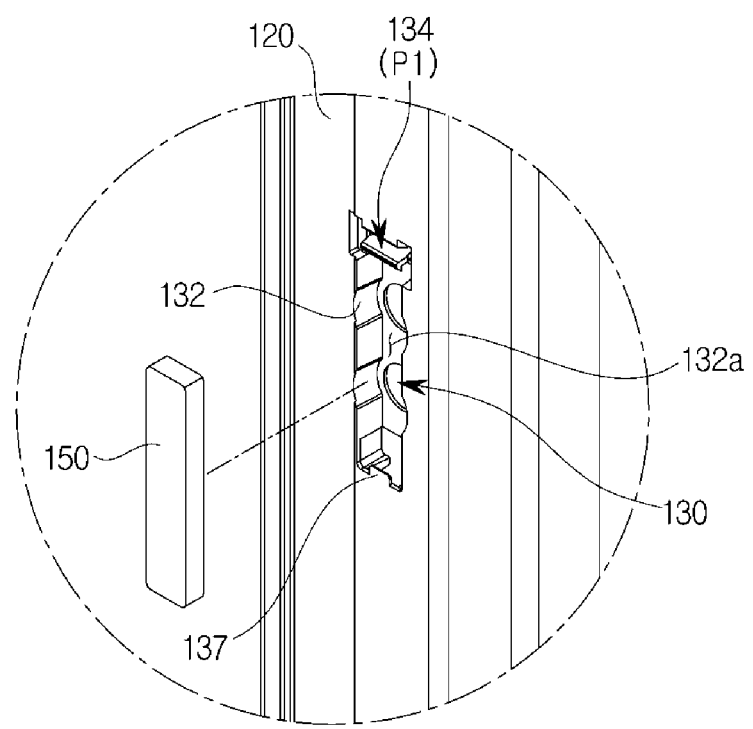
FIG. 5 is a view illustrating mounting of a magnet of the display apparatus according to an example embodiment.
Figure 6:
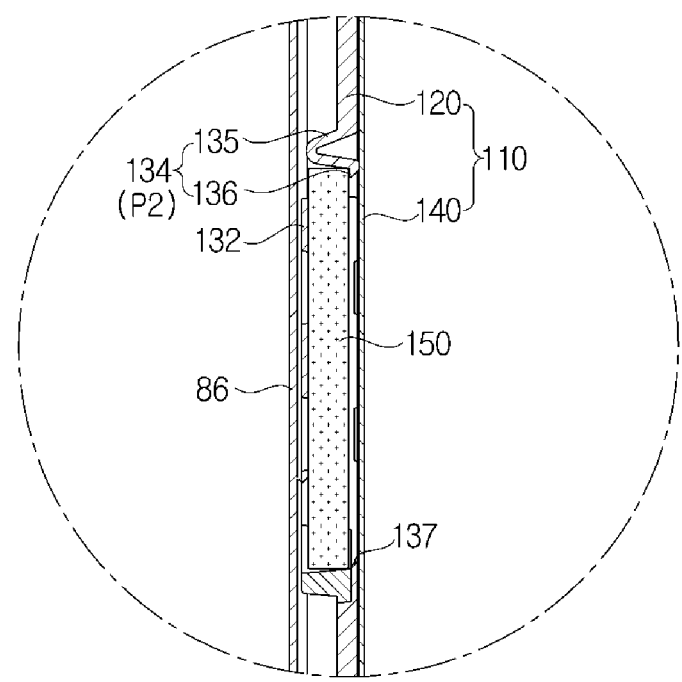
FIG. 6 is a cross-sectional view illustrating the mounting of the magnet of the display apparatus according to an example embodiment.

FIG. 5 is a view illustrating mounting of the magnet of the display apparatus according to an example embodiment, and FIG. 6 is a cross-sectional view illustrating the mounting of the magnet of the display apparatus according to an example embodiment. The mounting of the magnet will be described with reference to FIGS. 3 and 4.

The cover 100 may include a cover body 110 and a plurality of magnets 150.

The cover body 110 may be configured to cover the rear surface of the display chassis 80. In the present example embodiment, the cover body 110 is illustrated as being formed to be flat, but the present disclosure is not limited thereto. For example, the cover body 110 may be formed to have a curved surface, and may be configured to have a convex shape from the rear surface of the display chassis 80.

The cover body 110 may include the outer cover 140 and the inner cover 120.

The outer cover 140 may form a rear appearance of the display apparatus 1. The outer cover 140 may be formed of a metal material so that the rear surface of the display apparatus 1 is formed to have an appearance of a smooth surface. Specifically, the outer cover 140 may be formed of aluminum. The outer cover 140 may be formed of a metal material and may be configured to absorb or dissipate heat from the display apparatus 1.

The inner cover 120 is formed to be covered by the outer cover 140, and is configured to be located on an inner surface of the outer cover 140. The inner cover 120 and the outer cover 140 may be integrally formed, or may be configured as separate configurations, as in the present example embodiment. The inner cover 120 may include a plastic material.

The inner cover 120 may include a magnet holder 130 in which the plurality of magnets 150 are mounted.

The magnet holder 130 may be configured to mount the plurality of magnets 150 therein. Specifically, the magnet holder 130 may include a holder body 132, which forms a mounting space 132a in which the magnet 150 are mounted, and an elastic locking member 134, which is configured to prevent the magnets 150 mounted in the mounting space 132a from separating therefrom.

The holder body 132 may be configured to protrude from the inner cover 120 toward the display chassis 80. With this configuration, the magnet 150 may be located at a position close to the rear chassis 86 of the display chassis 80.

The elastic locking member 134 may be formed at one side of the holder body 132 and may be configured to be deformed (e.g., flexible) with elasticity by an external force. The elastic locking member 134 may include a locking body 135 which is elastically deformed and a locking protrusion 136 which is provided at an end of the locking body 135. The locking body 135 may be configured to be elastically deformed in one direction by an external force, and the locking protrusion 136 may be provided to fix one side of the magnet 150 mounted in the mounting space 132a.

The elastic locking member 134 may operate in a standby state P1, an elastically deformed state, and a mounted state P2. The elastic locking member 134 is in the standby state P1 when the magnet 150 is not present therein. When the magnet 150 is inserted into the mounting space 132a, the elastic locking member 134 is pressed by the magnet 150 and the elastic locking member 134 enters the elastically deformed state. In the elastically deformed state, the locking body 135 is elastically deformed.

When the magnet 150 is completely inserted into the mounting space 132a, the elastic locking member 134 moves to the mounted state P2. That is, the elastically deformed locking body 135 is resiliently restored and the locking protrusion 136 provided at the end of the locking body 135 restrains the one side of the magnet 150 so that the magnet 150 may be prevented from being separated from the mounting space 132a.

The magnet holder 130 may include a fixing protrusion 137. The fixing protrusion 137 is located at another side of the elastic locking member 134 with respect to the mounting space 132a and is configured to fix the other side (e.g., the opposite side from the elastic locking member 134) of the magnet 150. That is, when the magnet 150 is located in the mounting space 132a, the one side of the magnet 150 may be fixed by the locking protrusion 136 and the other side thereof may be fixed by the fixing protrusion 137.

The plurality of magnets 150 may be disposed inside the cover body 110. That is, the plurality of magnets 150 may be located on an inner surface of the cover 100 not to be exposed to the outside. The magnet 150 mounted on the inner surface of the cover 100 generates an attractive force when the cover 100 is located on a rear surface of the rear chassis 86 so that the cover 100 may be attached to the rear chassis 86. The plurality of magnets 150 may be configured such that the cover 100 is temporarily coupled to the rear chassis 86.

Figure 8:
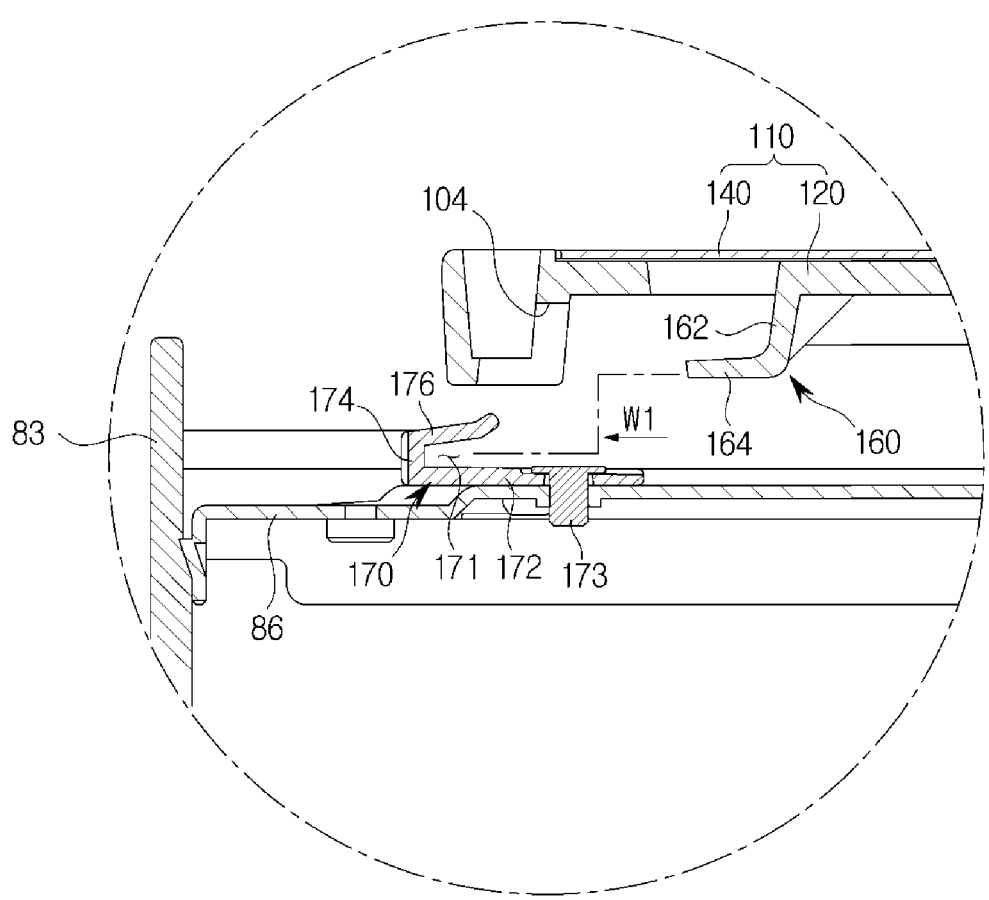
FIGS. 8 and 9 are cross-sectional views illustrating an operation in which a cover and a display chassis of the display apparatus are coupled by sliding according to an example embodiment.

There are no limitations on an arrangement and placement of the plurality of magnets 150, but the plurality of magnets 150 may be disposed in a first direction W1 (see FIG. 8). That is, as will be described below, the cover 100 may be positioned to slide in the first direction W1 (see FIG. 8) and cover the rear surface of the rear chassis 86. Since the plurality of magnets 150 are arranged in a direction in which the cover 100 slides, an attractive force between the rear chassis 86 and the plurality of magnets 150 gradually increases according to the sliding movement. There are no limitations on a magnetic intensity of each of the plurality of magnets 150, but the magnetic intensity may be configured to vary in the first direction W1. Specifically, the plurality of magnets 150 may be arranged to have a magnetic intensity that is increased in the first direction W1. The cover 100 and the display chassis 80 may be coupled and fixed to each other at lower portions of the cover 100 and the display chassis 80. As described above, since the magnets 150 is provided to have a magnetic intensity that is increased in the first direction W1, a fixing force between the cover 100 and the display chassis 80 may be improved.

Conversely, the plurality of magnets 150 may be arranged to have a magnetic intensity that is reduced in the first direction W1. In a case in which the cover 100 is detached from the rear chassis 86 with this configuration, when the lower portion of the cover 100 and the lower portion of the rear chassis 86 are separated from each other, an upper portion of the cover 100 and an upper portion of the rear chassis 86 may then also be easily separated from each other. That is, the cover 100 may be easily detached from the rear chassis 86.

There are no limitations on the magnetic intensity of each of the plurality of magnets 150, and the plurality of magnets 150 may be formed to have the same magnetic intensity.

Figure 7:
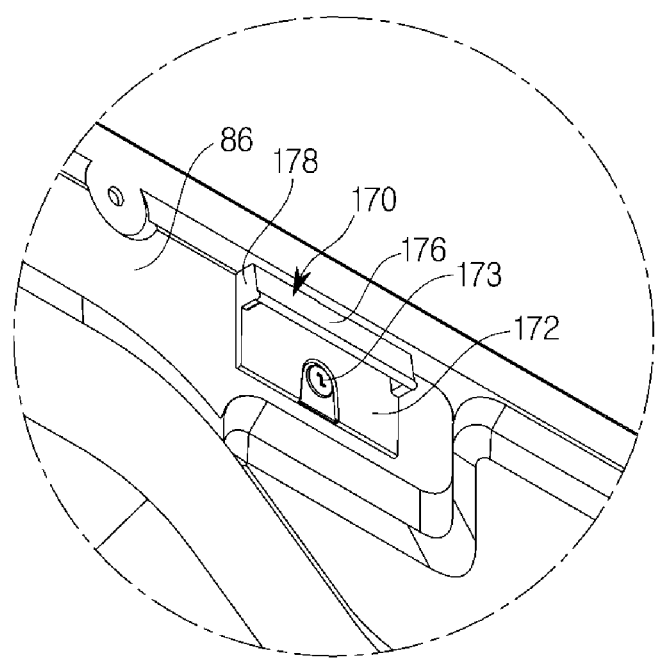
FIG. 7 is an enlarged view of portion A of FIG. 3.
Figure 9:
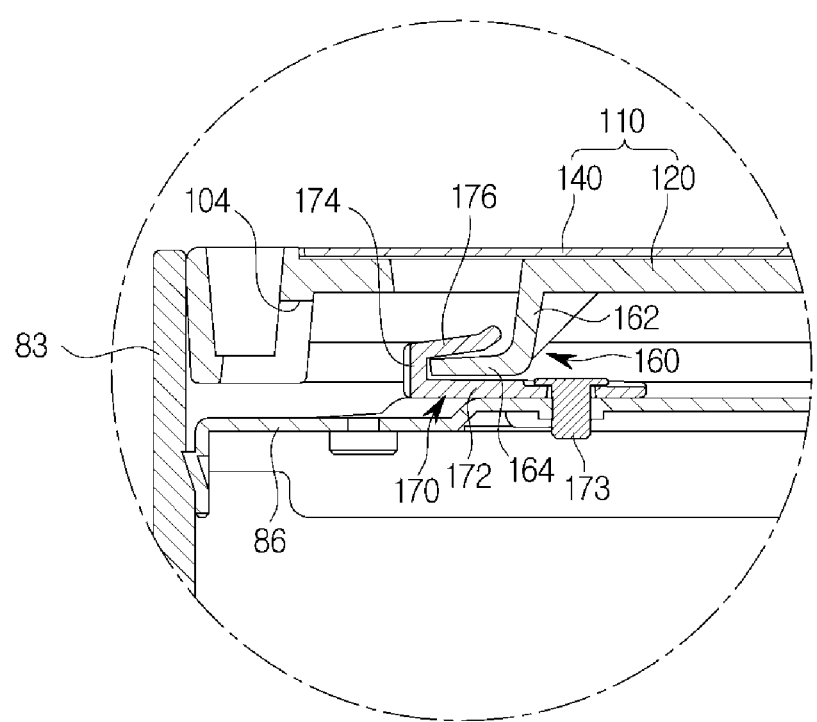

FIG. 7 is an enlarged view of portion A of FIG. 3, and FIGS. 8 and 9 are cross-sectional views illustrating an operation in which the cover and the display chassis of the display apparatus according to an example embodiment of the present disclosure are coupled by sliding.

The cover 100 may include a sliding coupler 160. The display chassis 80 may include a sliding holder 170. The sliding coupler 160 may be configured to be fitted and coupled to the sliding holder 170.

The sliding holder 170 may be provided on the rear surface of the rear chassis 86 of the display chassis 80. The sliding holder 170 may be open in the first direction W1, and a plurality of sliding holders 170 may be provided in a second direction W2 (see FIG. 3) perpendicular to the first direction W1. The present disclosure is not limited thereto, and the sliding holder 170 may be formed to extend in the second direction W2 (see FIG. 3). The second direction W2 (see FIG. 3) may be a lateral direction (e.g., along left and/or right edges) of the display apparatus 1.

The sliding holder 170 may include a fixed body 172, a stopper 174 bent from the fixed body 172, and an anti-detach rib 176 bent from the stopper 174. The fixed body 172 may be coupled and fixed to the rear chassis 86 through a screw coupler 173. The fixed body 172, the stopper 174, and the anti-detach rib 176 may form an insertion space 171 into which the sliding coupler 160 is inserted.

The stopper 174 restricts movement of the sliding coupler 160 in the first direction W1 when the sliding coupler 160 is inserted into the insertion space 171 so that the cover 100 may be positioned at a predetermined location in a rear side of the rear chassis 86.

The anti-detach rib 176 may be formed to be bent from the stopper 174 so that the sliding coupler 160 inserted into the insertion space 171 may be configured not to be detached therefrom in a rearward direction. The anti-detach rib 176 may be spaced a predetermined distance from the fixed body 172 to form the insertion space 171 having a height corresponding to the predetermined distance. The anti-detach rib 176 may be formed to have a predetermined angle with the stopper 174 and may be configured to be bent. The anti-detach rib 176 and the stopper 174 may be formed to have a right angle or to have an obtuse angle greater than a right angle so that an inner surface of the anti-detach rib 176 may serve as a guide for guiding the sliding coupler 160 into the insertion space 171.

The sliding holder 170 may include a side stopper 178.

The side stopper 178 may be formed to divide a side portion of the insertion space 171. That is, the side stopper 178 may be configured to form side surfaces of the fixed body 172, the stopper 174, and the anti-detach rib 176.

The sliding coupler 160 may be provided in the inner cover 120 of the cover 100. The sliding coupler 160 may be integrally formed with the inner cover 120. The sliding coupler 160 may be formed to extend from the inner cover 120 so that the sliding coupler 160 is configured to be inserted into the insertion space 171 of the sliding holder 170 when the cover 100 slides on the rear surface of the rear chassis 86 in the first direction W1.

The sliding coupler 160 may be configured to protrude from the inner cover 120 toward the rear chassis 86 so that the predetermined space 110a may be formed between the cover 100 and the rear chassis 86 even when the cover 100 is located on the rear chassis 86.

The sliding coupler 160 may include a coupling protrusion member 162 which protrudes from the inner cover 120 and an insertion member 164 which extends from the coupling protrusion member 162. The insertion member 164 is configured to be inserted into the insertion space 171 of the sliding holder 170 when the cover 100 slides on the rear chassis 86 in the first direction W1. The movement of the insertion member 164 may be restricted by the stopper 174 and the side stopper 178, and the detachment of the insertion member 164 may be prevented by the anti-detach rib 176.

Figure 10:
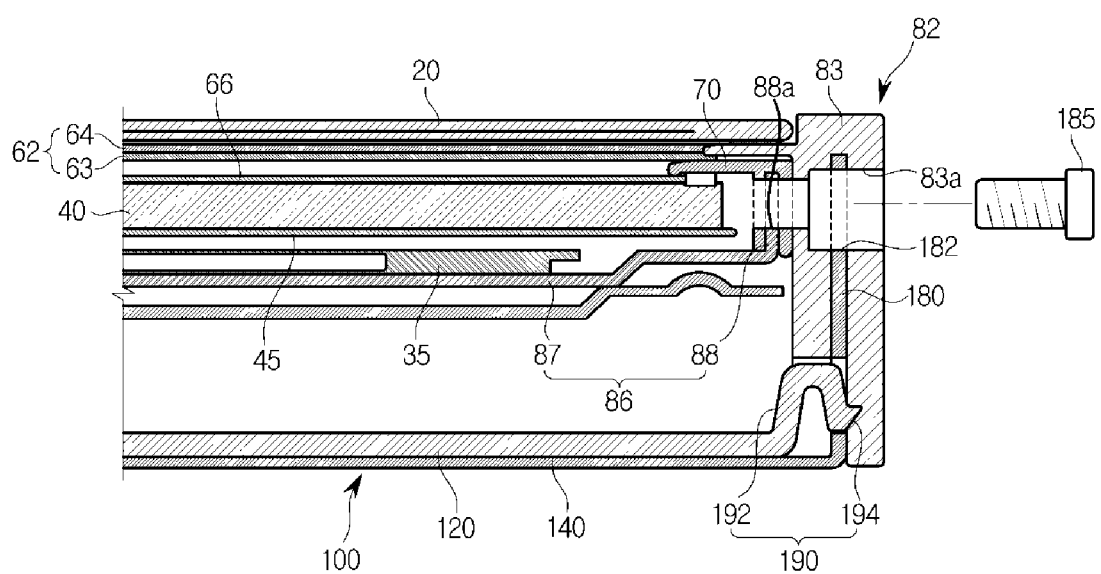
FIG. 10 is a cross-sectional view of a coupled portion of the cover and the display chassis of the display apparatus according to an example embodiment.

FIG. 10 is a cross-sectional view of a coupled portion of the cover and the display chassis of the display apparatus according to an example embodiment.

The cover 100 may include a cover locker 190. The cover locker 190 may be formed on the inner cover 120. The cover locker 190 may be provided on an end of one side of the inner cover 120, and may be configured to be elastically deformed and engaged with the display chassis 80 when the inner cover 120 is located on the rear surface of the rear chassis 86.

The cover locker 190 may include a cover locking body 192 which is elastically deformed, and a cover locking protrusion 194 which is provided at an end of the cover locking body 192. The cover locking body 192 may be configured to be elastically deformed in one direction by an external force, and the cover locking protrusion 194 may be provided such that one end of the inner cover 120 is fixed to an inner surface of the edge 83 of the display chassis 80 when the inner cover 120 covers the rear surface of the rear chassis 86.

The cover 100 may include a cover coupler 180. The cover coupler 180 may be provided on a side surface of the cover body 110, and may be configured to be coupled to the display chassis 80. The cover coupler 180 may be formed to be bent from at least a part of a periphery of the cover body 110, and may be configured to face the edge 83 of the front chassis 82 of the display chassis 80. A cover hole 182 for a screw coupler 185 may be formed in the cover coupler 180. A rim hole 83a may be formed at a location corresponding to the cover hole 182 in the edge 83. The cover hole 182 and the rim hole 83a may be coupled by the screw coupler 185 so that the cover 100 and the display chassis 80 may be coupled to each other. That is, the cover 100 may be attached or temporarily coupled to the rear chassis 86 of the display chassis 80 by the magnet 150, and may be coupled to the edge 83 by the cover coupler 180 and the edge 83 being screw coupled.

In FIG. 10, the rear chassis hole 88a of the rear chassis 86, the rim hole 83a of the edge 83, and the cover hole 182 of the cover 100 are configured to be coupled to each other, but the present disclosure is not limited thereto, and only the rim hole 83a and the cover hole 182 may be coupled to each other.

As described above, the cover 100 does not have a coupling structure on a rear surface thereof, and the cover 100 may be fixed to the display chassis 80 by being temporarily coupled with the rear chassis 86 by the magnet 150 and the edge 83 of the front chassis 82 and the corresponding cover coupler 180 being coupled. Accordingly, the cover 100 may be coupled to the display chassis 80 without a coupling structure being formed on the rear surface of the display apparatus 1. With this structure, the display apparatus may be configured such that the rear surface thereof has a clean appearance.

Further, when the cover 100 is coupled to the display chassis 80, the cover 100 and the display chassis 80 are temporarily coupled to each other through a structure of the magnet 150, the sliding coupler 160, the sliding holder 170, and the cover locker 190 so that screw coupling may be minimized, and thus an assembly process may be improved. Before the cover coupler 180 and the display chassis 80 are assembled, the cover 100 may be located at a predetermined location in the rear side of the display chassis 80 through the above-described configurations, and thus the cover coupler 180 and the display chassis 80 may be more accurately assembled.

Hereinafter, a display apparatus according to another example embodiment will be described. Descriptions of the same configurations as those described above will be omitted.

Figure 11:
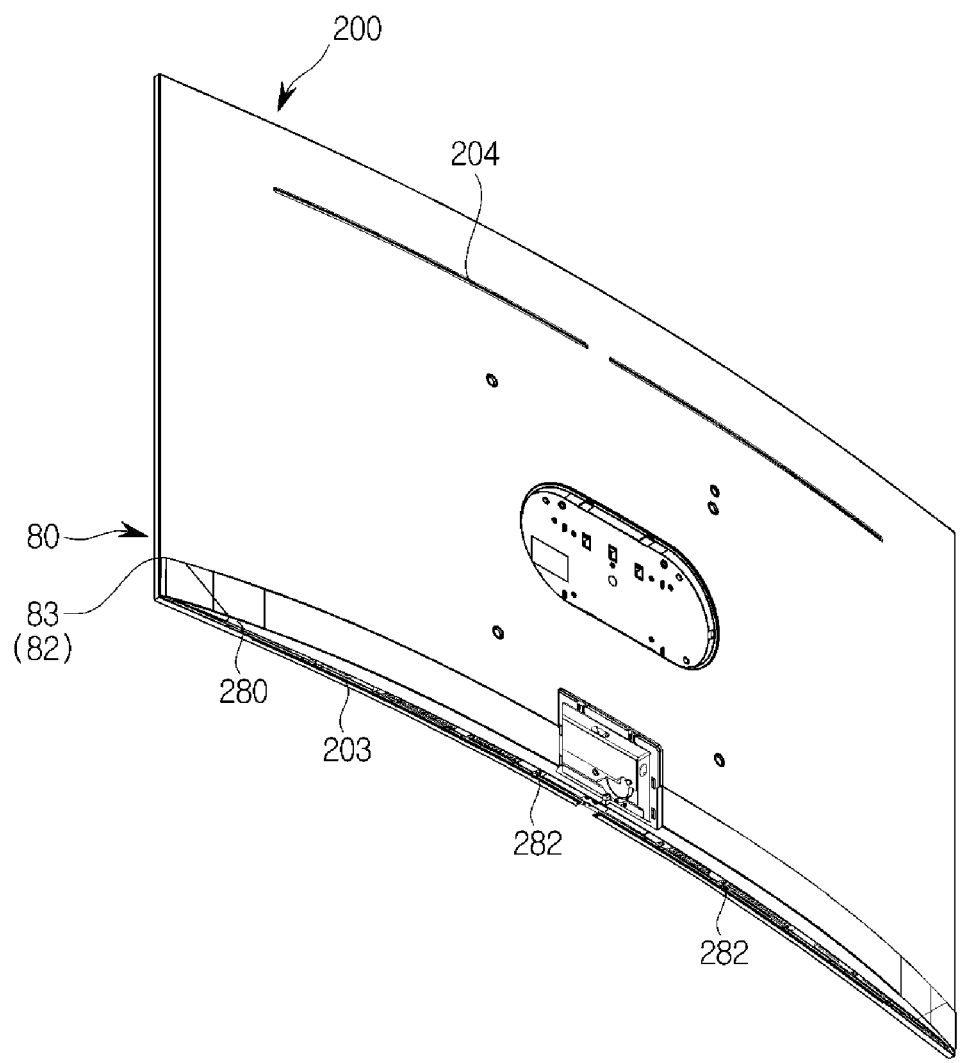
FIG. 11 is a rear perspective view a display apparatus according to another example embodiment.
Figure 12:
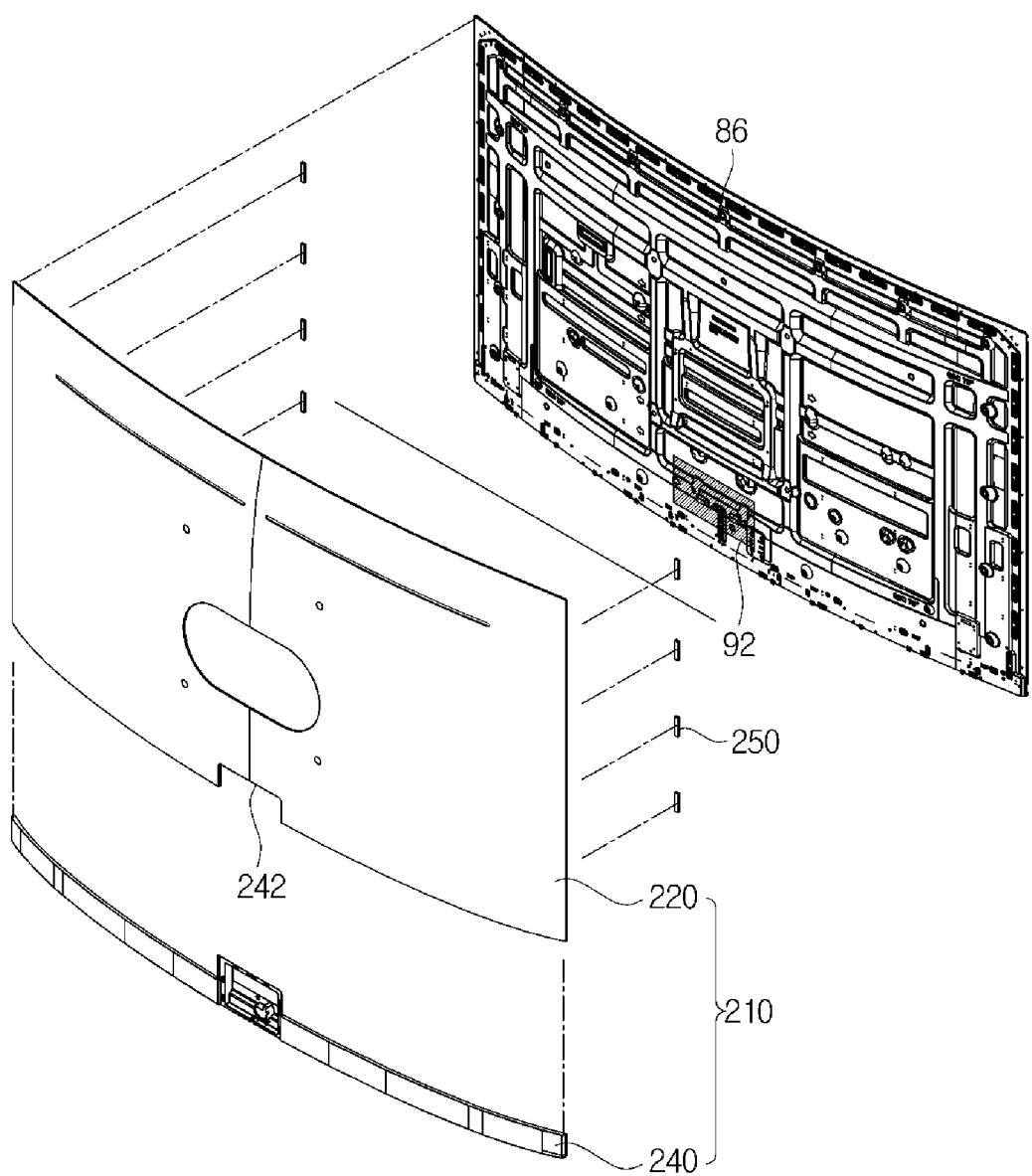
FIG. 12 is an exploded perspective view of the display apparatus according to another example embodiment.
Figure 13:
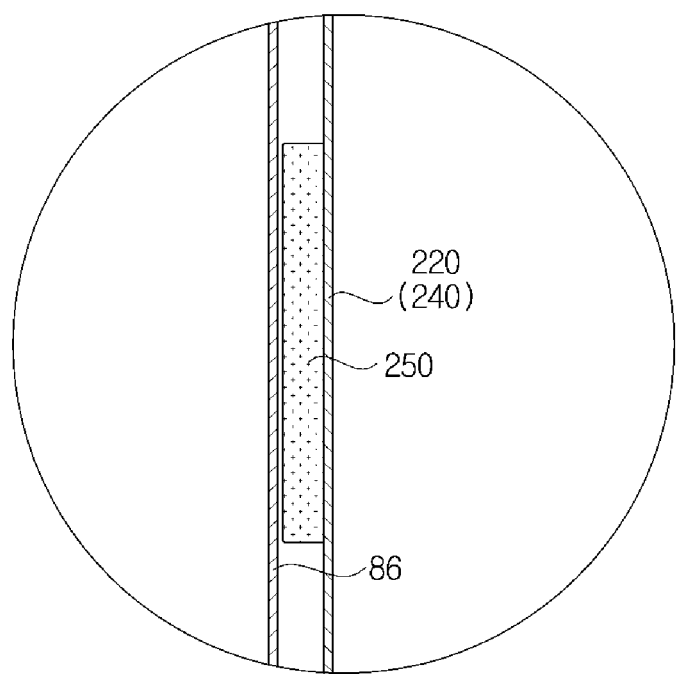
FIG. 13 is a view illustrating an arrangement of a magnet of the display apparatus according to another example embodiment.

FIG. 11 is a rear perspective view a display apparatus according to another example embodiment, FIG. 12 is an exploded perspective view of the display apparatus according to another example embodiment, and FIG. 13 is a view illustrating an arrangement of a magnet of the display apparatus according to another example embodiment.

A cover 200 may include a cover body 210 and a plurality of magnets 250.

The cover body 210 may be configured to cover the rear surface of the display chassis 80. The cover body 210 is illustrated as being formed to have a curved surface in the present example embodiment, but the present disclosure is not limited thereto.

The cover body 210 may include a first cover 220 and a second cover 240. The first cover 220 may be formed of a metal, and may be configured to cover at least a part of the rear chassis 86. The second cover 240 may be formed of plastic, may be disposed below the first cover 200, and may be configured to cover a part of the rear chassis 86 other than the part covered by the first cover 220. The first cover 220 may be formed of a metal material and may be configured to absorb or dissipate heat from the display apparatus. The wireless communicator 92 may be disposed on a back surface of the rear chassis 86. The first cover 220 may include a cover opening 242 which is partially opened for effective communication of the wireless communicator 92. However, the present disclosure is not limited thereto, and, the cover body 210 may be disposed such that the wireless communicator 92 is covered by the second cover 240. In this case, a separate open configuration of the cover body 210 may be omitted. The cover body 210 includes the first cover 220 made of a metal and the second cover 240 made of plastic so that heat dissipation efficiency may be improved and restrictions on the arrangement of the electrical components or the wireless communicator may be reduced.

The plurality of magnets 250 may be disposed on an inner surface of the cover body 210. The plurality of magnets 250 may be attached and fixed to the inner surface of the cover body 210 with an adhesive material such as an adhesive. However, there are no limitations on a placement and arrangement of the plurality of magnets 250. For example, the magnet holder 230 in the above-described embodiment may be applied to the cover 200 so that the magnet 250 may be configured to be fixed thereto. The plurality of magnets 250 may be disposed on an inner surface of the first cover 220, but the present disclosure is not limited thereto, and the plurality of magnets 250 may be formed on both of inner surfaces of the first and second covers 220 and 240.

Vent holes 203 and 204 may be provided in the cover 200. However, the present disclosure is not limited thereto, and a first vent hole 203 may be formed in the edge 83 of the display chassis 80 and a second vent hole 204 may be disposed in the cover 200.

The cover 200 may include a cover coupler 280.

The cover coupler 280 may be provided on a side surface of the cover body 210 and may be configured to be coupled to the display chassis 80. The cover coupler 280 may be formed to be bent from at least a part of a periphery of the cover body 210 and may be configured to face the edge 83 of the front chassis 82 of the display chassis 80. The cover hole 282 of the cover coupler 280 and the edge 83 may be coupled to each other through screw coupling.

As described above, the cover 200 does not have a coupling structure on a rear surface thereof, and the cover 200 may be fixed to the display chassis 80 by being temporarily coupled with the rear chassis 86 by the magnet 250 and being coupled to the front chassis 82 by the cover coupler 280 formed at a periphery of the cover 200. Accordingly, the cover 200 may be coupled to the display chassis 80 without a coupling structure being formed on the rear surface of the display apparatus. With this structure, the display apparatus may be configured such that the rear surface thereof has a more streamlined appearance.

Hereinafter, a display apparatus according to still another example embodiment will be described. Descriptions of the same configurations as those described above will be omitted.

Figure 14:
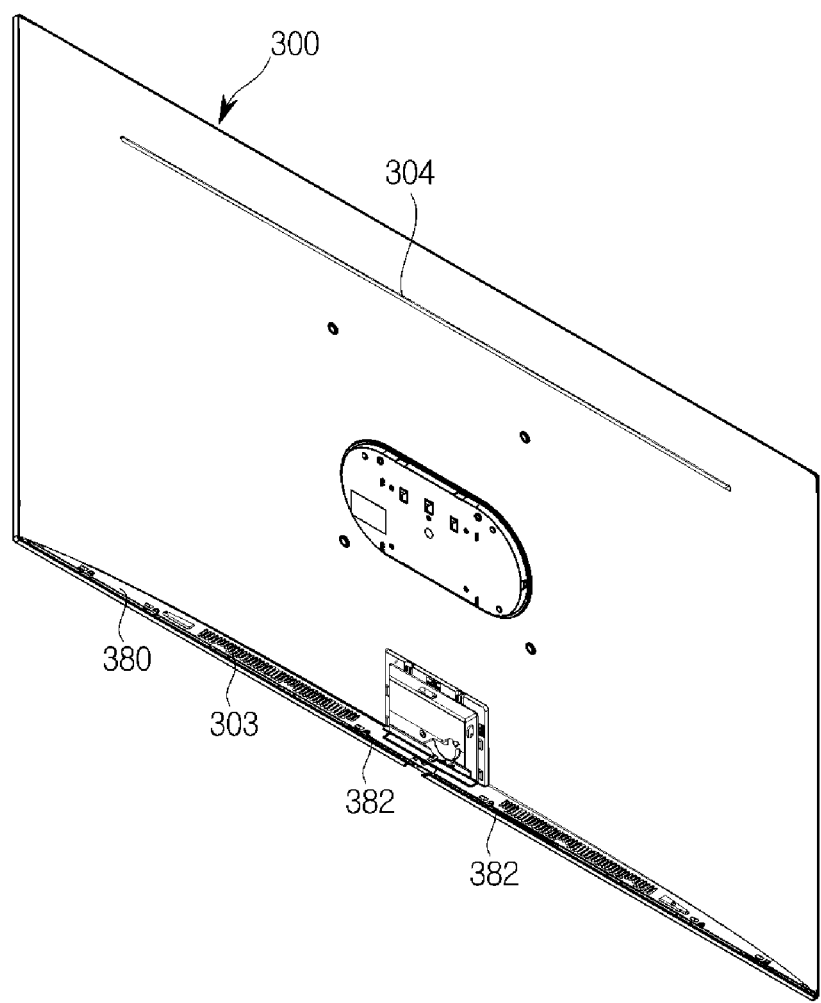
FIG. 14 is a rear perspective view of a display apparatus according to still another example embodiment.
Figure 15:
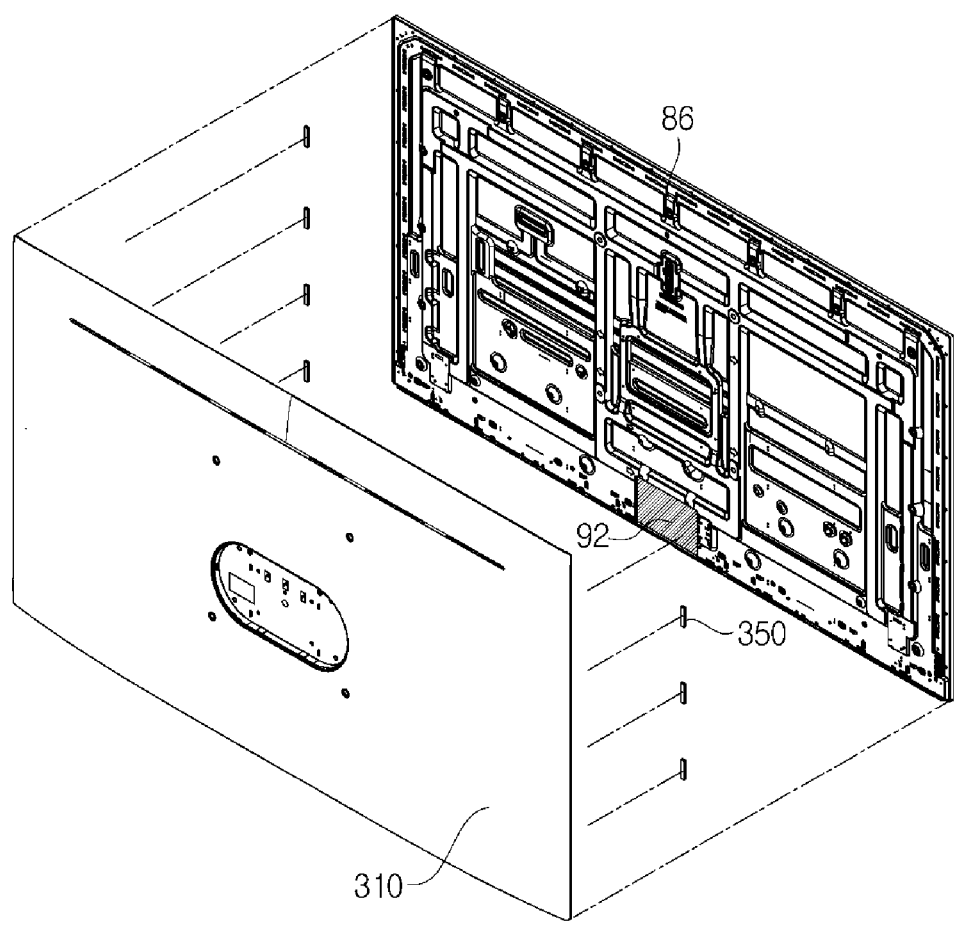
FIG. 15 is an exploded perspective view of the display apparatus according to still another example embodiment.
Figure 16:
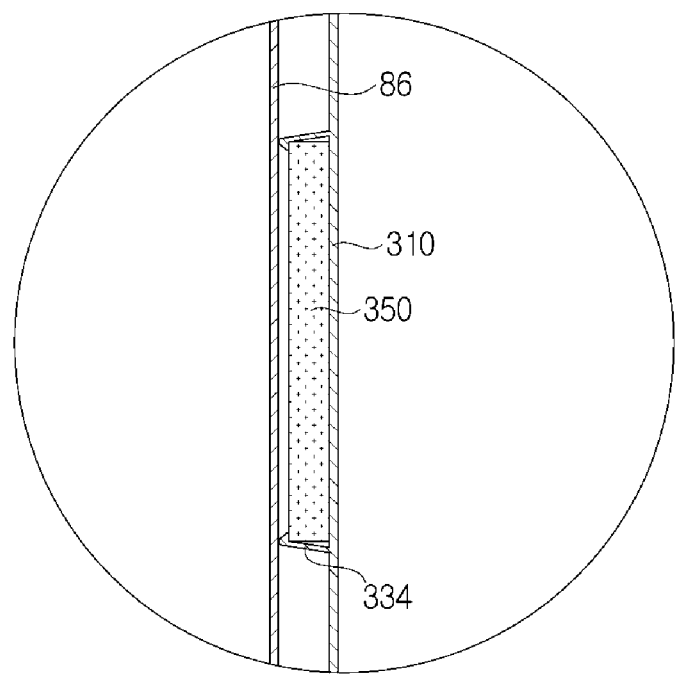
FIG. 16 is a view illustrating an arrangement of a magnet of the display apparatus according to still another example embodiment.

FIG. 14 is a rear perspective view of a display apparatus according to still another example embodiment, FIG. 15 is an exploded perspective view of the display apparatus according to still another example embodiment, and FIG. 16 is a view illustrating an arrangement of a magnet of the display apparatus according to still another example embodiment.

A cover 300 may include a cover body 310 and a plurality of magnets 350.

The cover body 310 may be configured to cover the rear surface of the display chassis 80. The cover body 310 is illustrated as being formed to have a curved surface in the present example embodiment, but the present disclosure is not limited thereto.

The cover body 310 may include a magnet holder 334 on which the plurality of magnets 350 are mounted. The magnet holder 334 is provided to be elastically deformed and is configured such that the magnet 350 is attached and fixed to an inner surface of the cover body 310. The magnet holder 334 may be integrally formed with the cover body 310. The cover 300 may include plastic so that wireless communication of the wireless communicator 92 may be possible without a separate open configuration through the cover 300. Therefore, the wireless communicator 92 may be freely disposed. The cover body 310 and the magnet holder 334 may be integrally formed by forming the cover 300 of plastic, and thus manufacturing efficiency may be improved.

However, the present disclosure is not limited thereto, and the plurality of magnets 350 may be attached and fixed to the inner surface of the cover body 310 with an adhesive material such as an adhesive.

Vent holes 303 and 304 may be provided in the cover 300. However, the present disclosure is not limited thereto, and a first vent hole 303 may be formed in the edge 83 of the display chassis 80 and a second vent hole 304 may be disposed in the cover 300.

The cover 300 may include a cover coupler 380.

The cover coupler 380 may be provided on a side surface of the cover body 310 and may be configured to be coupled to the display chassis 80. The cover coupler 380 may be formed to be bent from at least a part of a periphery of the cover body 310 and may be configured to face the edge 83 of the front chassis 82 of the display chassis 80. The cover hole 382 of the cover coupler 380 and the edge 83 may be coupled to each other through screw coupling.

As described above, the cover 300 does not have a coupling structure on a rear surface thereof, and the cover 300 may be fixed to the display chassis 80 by being temporarily coupled with the rear chassis 86 by the magnet 350 and being coupled to the front chassis 82 by the cover coupler 380 formed at a periphery of the cover 300. Accordingly, the cover 300 may be coupled to the display chassis 80 without a coupling structure being formed on the rear surface of the display apparatus. With this structure, the display apparatus may be configured such that the rear surface thereof has a clean appearance.

According to an aspect of the present disclosure, an assembly structure of a cover can be improved, and thus assembly efficiency of a display apparatus can be improved.

According to another aspect of the present disclosure, since a cover is temporarily coupled to a display chassis by a magnet, the number of assembly processes can be reduced and more accurate assembly can be achieved.

According to still another aspect of the present disclosure, coupling durability of a display chassis and a cover can be improved.

Example embodiments of the present disclosure have been illustrated and described above. However, the present disclosure is not limited to the above-described example embodiments, and it should be understood by those skilled in the art that various modifications and alterations may be made therein without departing from the spirit and scope of the present disclosure described in the appended claims.

What is claimed is:

1. A display apparatus comprising:
  a display panel;
  a display chassis configured to support the display panel; and
  a cover provided on a rear side of the display chassis, the cover comprising:
    a plurality of magnets disposed on the cover and configured to generate an attractive force such that the cover is attached to a rear surface of the display chassis,
  wherein the plurality of magnets are disposed on a rear side of the display chassis,
  wherein the cover is configured to be coupled and fixed to at least a part of peripheries of the display chassis,
  wherein the cover further comprises:
    an outer cover body, and
    an inner cover body disposed adjacent to the outer cover and having a magnet holder for mounting at least one of the plurality of magnets, the magnet holder being disposed between the inner cover body and the outer cover body.

2. The display apparatus according to claim 1, wherein the plurality of magnets are disposed inside the cover.

3. The display apparatus according to claim 1, wherein the cover further comprises a cover coupler provided on a side surface of the cover and configured to be coupled to a side surface of the display chassis.

4. The display apparatus according to claim 3, wherein the display chassis comprises:
  a rear chassis configured to support a rear side of the display panel; and
  a front chassis having an edge disposed along a periphery of the display panel, and
  wherein the cover coupler is configured to be bent from the cover and face the edge of the front chassis.

5. The display apparatus according to claim 4, wherein the cover is coupled to a rear surface of the rear chassis due to the attractive force of the plurality of magnets, and
  wherein the cover is fixed to the display chassis by coupling the cover coupler and the edge of the front chassis.

6. The display apparatus according to claim 5, wherein the display chassis further comprises a sliding holder provided on the rear surface of the display chassis, and
  wherein the cover further comprises a sliding coupler provided inside the cover and fitted and coupled to the sliding holder in a first direction when being coupled with the sliding holder.

7. The display apparatus according to claim 6, wherein the plurality of magnets are arranged in the first direction.

8. The display apparatus according to claim 1, further comprising:
  a printed circuit board (PCB) provided on the rear surface of the display chassis;
  a first vent hole formed in one of the cover and the display chassis and formed below the PCB; and
  a second vent hole formed in one of the cover and the display chassis and formed above the PCB.

9. The display apparatus according to claim 1, wherein the magnet holder is formed to protrude from the inner cover body toward the rear surface of the display chassis.

10. The display apparatus according to claim 9, wherein the magnet holder forms a mounting space configured to be covered by the outer cover body, and wherein the at least one of the plurality of magnets is mounted in the mounting space.

11. The display apparatus according to claim 1, wherein the magnet holder comprises an elastic locking member configured to prevent the at least one of the plurality of magnets from being separated from the magnet holder when the at least one of the plurality of magnets is mounted in a mounting space in the magnet holder.

12. The display apparatus according to claim 1, wherein the outer cover body includes a metal, and
wherein the inner cover body includes plastic.

13. The display apparatus according to claim 1, wherein the cover is integrally formed with the magnet holder.

14. The display apparatus according to claim 1, wherein the cover is fitted and coupled to the display chassis in a first direction,
   wherein the plurality of magnets are arranged in the first direction, and
   wherein an intensity of a magnetic force of each of the plurality of magnets varies among the plurality of magnets in the first direction.

\* \* \* \* \*